(12) United States Patent
Bajdechi et al.

(10) Patent No.: US 7,701,295 B2
(45) Date of Patent: Apr. 20, 2010

(54) HIGH-EFFICIENCY CLASS-AB AMPLIFIER

(75) Inventors: Ovidiu Bajdechi, Delft (NL);
Christopher M. Ward, Utrecht (NL);
Klaas Bult, Bosch en Duin (NL)

(73) Assignee: Broadcom Corporation, Irvine, CA (US)

( * ) Notice: Subject to any disclaimer, the term of this patent is extended or adjusted under 35 U.S.C. 154(b) by 26 days.

(21) Appl. No.: 11/798,293

(22) Filed: May 11, 2007

(65) Prior Publication Data
US 2007/0273442 A1 Nov. 29, 2007

Related U.S. Application Data

(60) Provisional application No. 60/799,344, filed on May 11, 2006.

(51) Int. Cl.
*H03F 1/52* (2006.01)
(52) U.S. Cl. ...................... 330/298; 330/255
(58) Field of Classification Search ............... 330/255, 330/298
See application file for complete search history.

(56) References Cited

U.S. PATENT DOCUMENTS 5,166,635 A * 11/1992 Shih ........................... 330/253
6,150,883 A * 11/2000 Ivanov ........................ 330/253
6,384,683 B1 * 5/2002 Lin ............................. 330/257
7,187,235 B2 * 3/2007 Moon .......................... 330/255

OTHER PUBLICATIONS

Huijsing, J.H., "Operational Amplifiers: Theory and Design," ISBN 0-7923-7284-0, Kluwer Academic Publishers (2001).

* cited by examiner

*Primary Examiner*—Steven J Mottola
(74) *Attorney, Agent, or Firm*—Sterne, Kessler, Goldstein & Fox P.L.L.C.

(57) ABSTRACT

A high efficiency class-AB amplifier is disclosed. The amplifier comprises a first input stage and a second input stage, both coupled to a class-AB biasing mesh and an output stage, wherein the outputs of the first and second input stages are directly coupled to the output transistors in the output stage. In one embodiment, a first gate of the first input stage and of the second input stage are coupled together to receive the same input and a second gate of the first input stage and of the second input stage are coupled together to receive the same input. In another embodiment, the first input stage and second input stage may further comprise cascode transistors for coupling the two input stages to the class-AB biasing mesh. In yet another embodiment, a 3V supply is used and 1V transistors are used to improve gain and 3V transistors are used to protect the 1V transistors.

19 Claims, 5 Drawing Sheets

HIGH-EFFICIENCY CLASS-AB AMPLIFIER

CROSS-REFERENCE TO RELATED APPLICATIONS

This application claims benefit to U.S. Provisional Application No. 60/799,344, filed on May 11, 2006, which is incorporated by reference in its entirety.

FIELD OF THE INVENTION

The present invention relates generally to electronic amplifiers, and more specifically to a high efficiency class-AB amplifier.

BACKGROUND OF THE INVENTION

Class-AB amplifiers are used in power-sensitive applications where the processed analog signals present a large crest factor (i.e. large ratio between average and peak instantaneous values) and/or large peak currents are required. One example of such an application is a line driver. Referring now to FIG. 1, there is shown a high level diagram (100) of a conventional class-AB amplifier used as a line driver. In FIG. 1, a voltage amplifier (102) is connected in a feedback circuit and applies an input signal VSIG (104) to a load resistor, RL (106), supplying all the needed load current while isolating the signal source VSIG (104) from the load (106). As is known in the art, for a high open-loop gain in the amplifier (102), the voltage applied on the load resistor (106) will be approximately equal with VSIG (104), the needed large current being supplied by the amplifier.

As opposed to class-A amplifiers, class-AB amplifiers have biasing currents that are signal-dependent in such a way that, when required by a large signal peak, they can source or sink tens of times more current than their quiescent bias currents. One example of class-AB amplifiers well known to those skilled in the art is the two-stage, Miller-compensated designs with a feed-forward-biased class-AB output stage (OS) and a class-A input stage (IS). See Johan H. Huijsing, "Operational Amplifiers: Theory and Design," Kluwer Academic Publishers, Boston 2001. These amplifiers have large low-frequency gain, small output impedance and a unity-gain bandwidth that is not signal dependent since the input stage transconductance is produced by a class-A current. With an output stage consuming low power, the power dissipated by the class-A stages in front of the output stage becomes important.

Referring now to FIG. 2, there is shown a high level diagram of a conventional feed-forward class-AB amplifier (200). In general, the class-AB amplifier (200) comprises an input stage (202) and an output stage (204) coupled together by a connecting stage (206), also referred to as a class-AB biasing mesh. The class-AB biasing mesh (206) provides the class-AB biasing to the output stage (204) and shifts internal signal phases in the correct way to fully exploit the gain of the class-AB output stage (204). As is known to those skilled in the art, the class-AB biasing mesh (206) does not provide active gain, so the power it burns does not increase the open-loop gain at all frequencies, and thereby reduces power efficiency.

Referring now to FIG. 3, there is shown a schematic diagram (300) of a conventional feed-forward class-AB amplifier which implements a folded-cascode. The amplifier in FIG. 3 comprises an input stage (302) and an output stage (304) coupled to a class-AB biasing mesh (306). In this example, the class-AB biasing mesh (306) is coupled to the input stage (302) through an intermediate stage designed as a folded-cascode (308). The intermediate stage (308) improves the low-frequency gain of the amplifier due to its cascodes and supplies the class-AB biasing mesh (306) with the in-phase current signals needed to drive the gates of the NMOS (310) and PMOS (312) transistors of the output stage (304). As is known to those skilled in the art, the class-AB biasing works by closing two translinear loops by means of biasing the "pm" (314) and "nm" (316) nodes with two voltages generated as the sum of the two gate-source voltages. In quiescent state, the two drain currents in the mesh transistors are designed to be equal and the translinear loops bias the output stage (304) to its quiescent current. When the input stage (302) is tilted, the signal currents drawn into or from the two ends of the mesh are equal and in phase so the total current in the two mesh transistors does not change. The mesh is tilted as well, so the ratio of the two currents in the NMOS and the PMOS mesh transistors is changed. This makes the output stage (304) tilt by either sinking or sourcing current. For example, if the current in the output NMOS transistor increases, then the current in the PMOS transistor decreases. At the limit, the PMOS transistor still drives a minimum current guaranteed by design, so the amplifier recovers very quickly from the fully-tilted state.

For a large-bandwidth amplifier, the intermediate folded-cascode stage only plays a role in supplying the class-AB biasing mesh with the two needed in-phase signal currents. The power consumption in this intermediate stage is at least two times the power of the input stage for slew-rate and linearity reasons. This amounts to a significant power wasted in the intermediate stage without actual improvement of amplifier performance.

Therefore, what is needed is a class-AB amplifier which eliminates this intermediate stage and does not waste power or current between the input stage and the class-AB biasing mesh, thereby increasing the power efficiency of the amplifier.

SUMMARY OF THE INVENTION

The present invention comprises a system and circuit, such as a high-efficiency class-AB amplifier, substantially as shown in and/or described in connection with at least one of the figures, as set forth more completely in the claims.

BRIEF DESCRIPTION OF SEVERAL VIEWS OF THE DRAWINGS

The accompanying drawings, which are incorporated herein and form a part of the specification, illustrate the present invention and together with the description, further serve to explain the principles of the invention and to enable a person skilled in the pertinent art to make and use the invention.

DETAILED DESCRIPTION OF THE INVENTION

The present invention will now be described in details with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

The present invention generally pertains to a high efficiency class-AB amplifier. In one embodiment, the present invention comprises two input stages which obviate the need for an intermediate stage connecting the input stage to the class-AB biasing mesh. As a result, no current is wasted between the input stages and the class-AB biasing mesh, and a higher power efficiency compared to the prior art is achieved.

Figure 1:
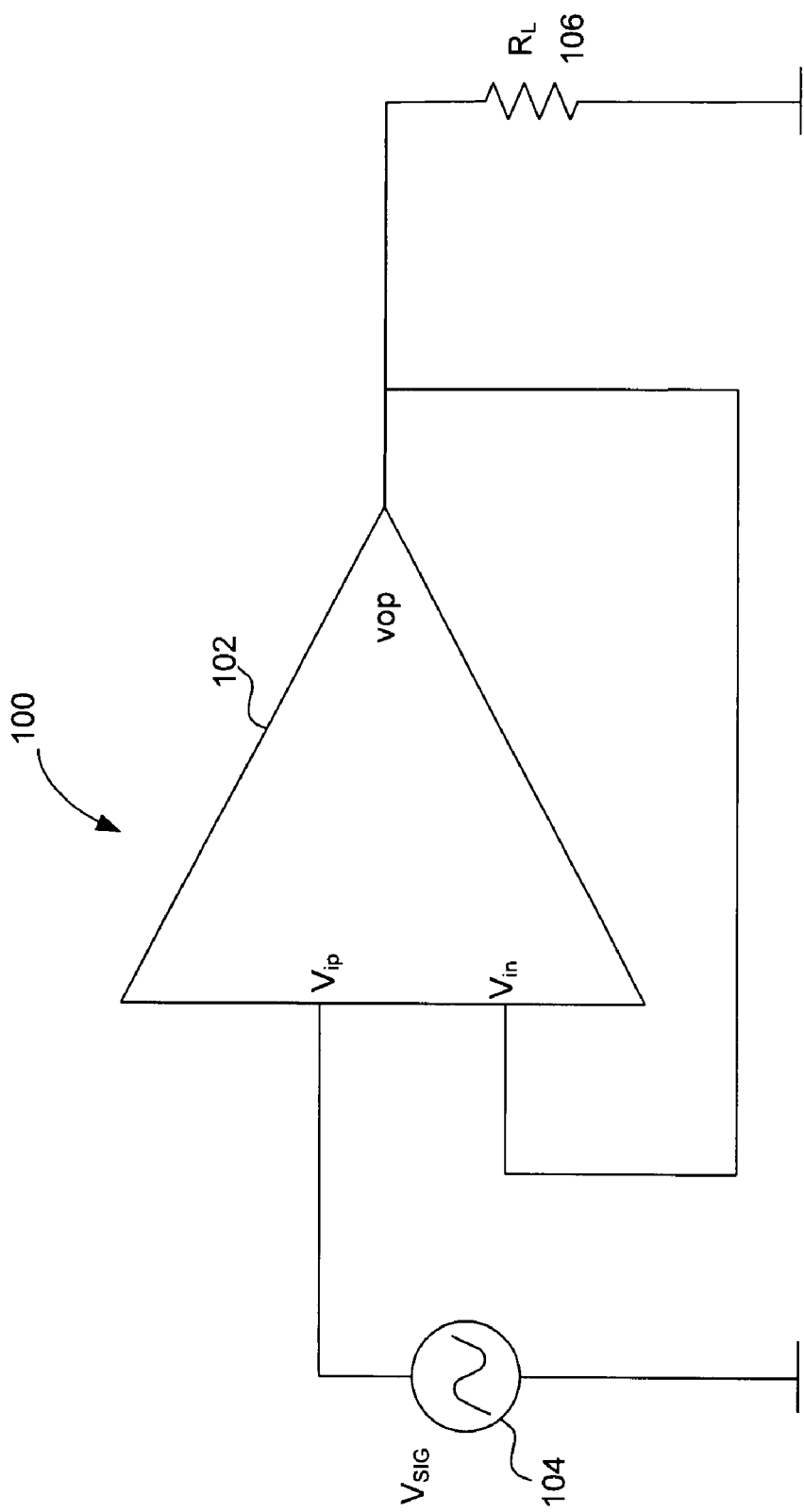
FIG. 1 is a high level diagram of a conventional class-AB amplifier used as a line driver.
Figure 2:
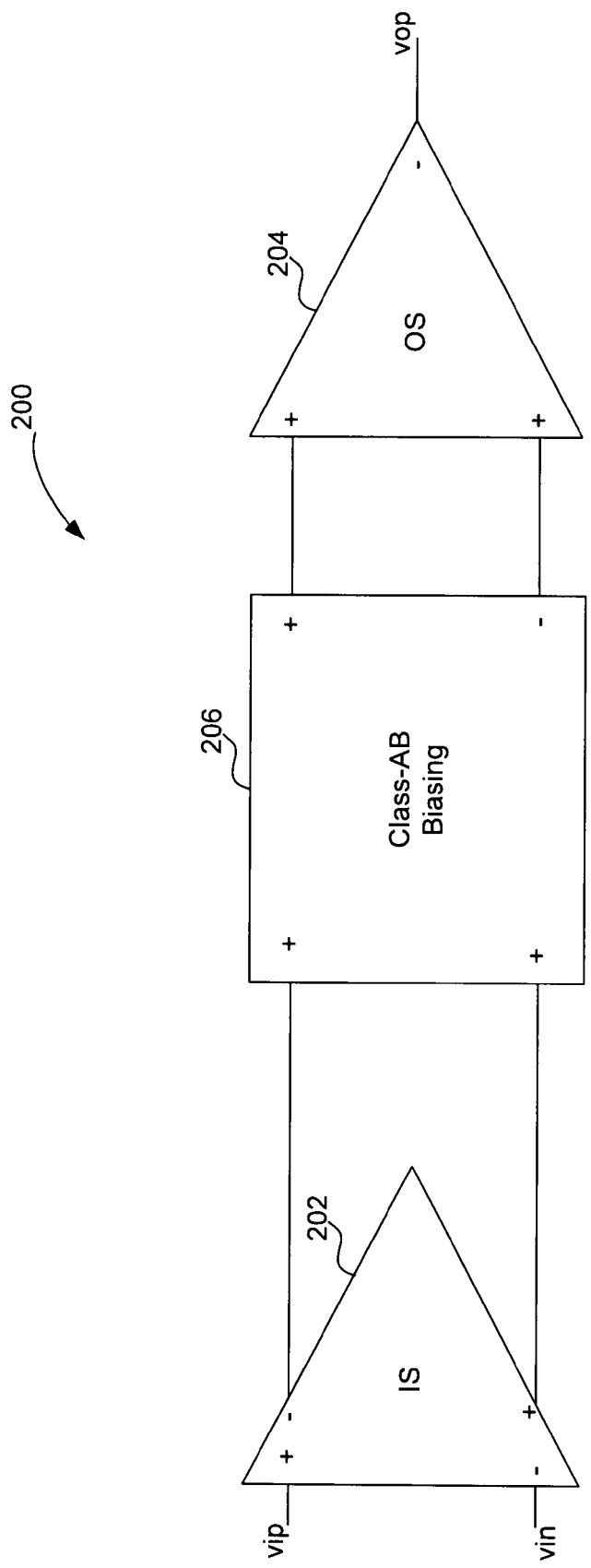
FIG. 2 is a high level diagram of a conventional feed-forward class-AB amplifier.
Figure 3:
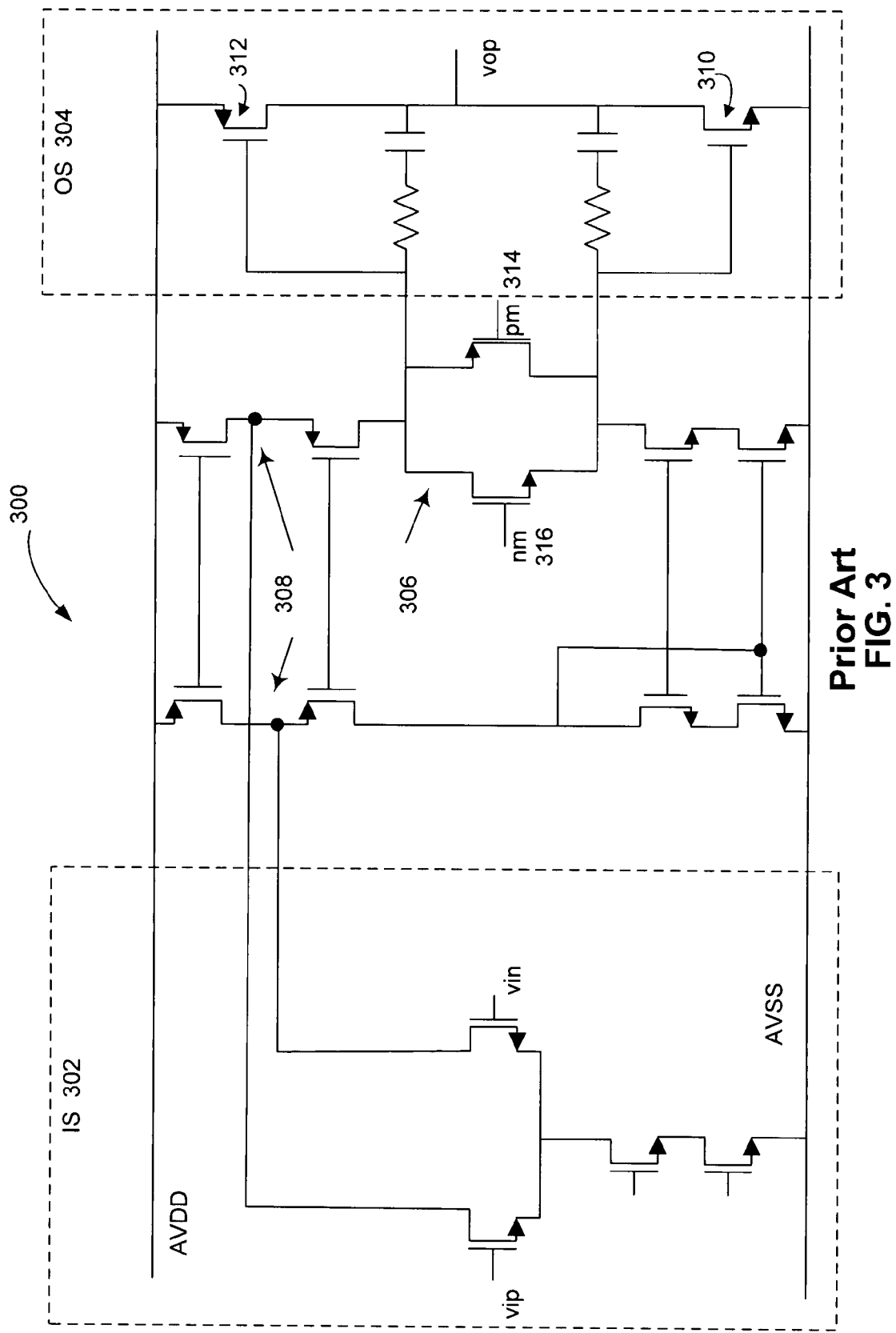
FIG. 3 is a schematic diagram of a conventional feed-forward class-AB amplifier.
Figure 4:
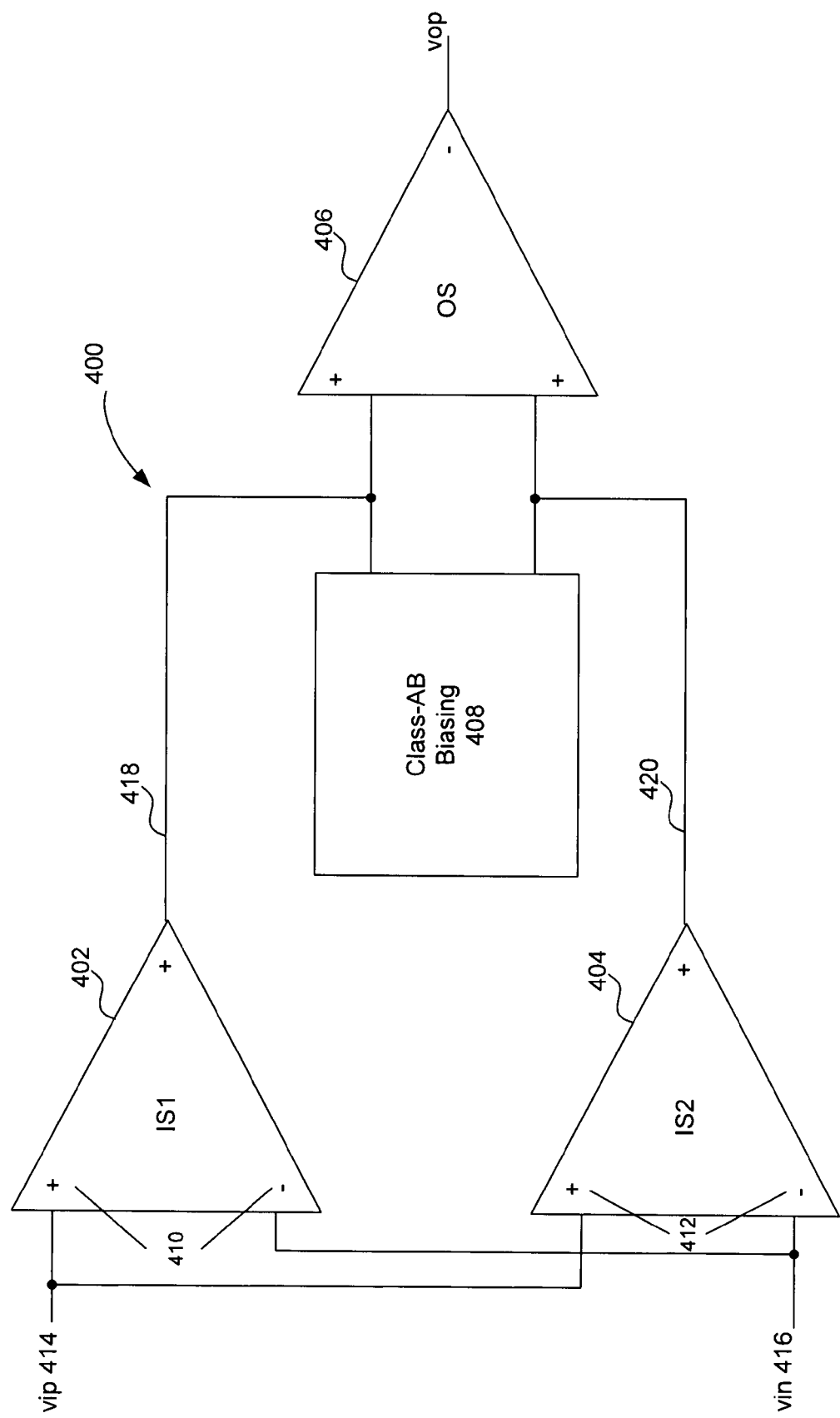
FIG. 4 is a high level diagram of one embodiment of the present invention comprising two input stages.

Referring now to FIG. 4, there is shown a high level diagram (400) of one embodiment of the present invention. The embodiment shown in FIG. 4 comprises two input stages (402, 404), an output stage (406) and a class-AB biasing mesh (408). In one embodiment of the present invention, the first input stage, IS1 (402) is a PMOS input stage and the second input stage, IS2 (404) is an NMOS input stage. One skilled in the art will realize that the present invention is not limited to this configuration and that other implementations for the two input stages may be used. In one embodiment of the present invention where the same prior art Miller capacitors are used and the same unity-gain frequency is required, then the sum of the tail currents of the two input stages (402, 404) of the present invention is equal to the tail current in the prior art design.

The differential pairs (410, 412) of both input stages (402, 404) have their gates connected together to form the two amplifier inputs "vip" (414) and "vin" (416). The resulting outputs (418, 420) of the first input stage and the second input stage are in-phase. The two in-phase outputs of this composite input stage (418, 420) are directly connected to the two ends of the class-AB biasing mesh (408). As a result, the two input stages (402, 404) drive the gates of the output transistors without passing through the additional delay of an intermediate stage as is typical in the prior art design. This direct connection in the present invention also improves the phase margin of the amplifier when placed in a feedback configuration. The only current that does not provide gain is the class-AB mesh bias current. Because the two ends of the class-AB biasing mesh (408) are directly driven by the two input stages (402, 404), the class-AB mesh biasing current can be much smaller than the tail current of the two input stages. As a result, by making a direct connection between the input stage and the output stage with the class-AB mesh driven at both ends, the present invention achieves a much higher power efficiency compared to the prior art. The present invention also avoids the need for an intermediate stage connecting the input stage to the class-AB biasing mesh, and therefore, no current is wasted between the input stage (402 and 404) and the class-AB biasing mesh (408).

Figure 5:
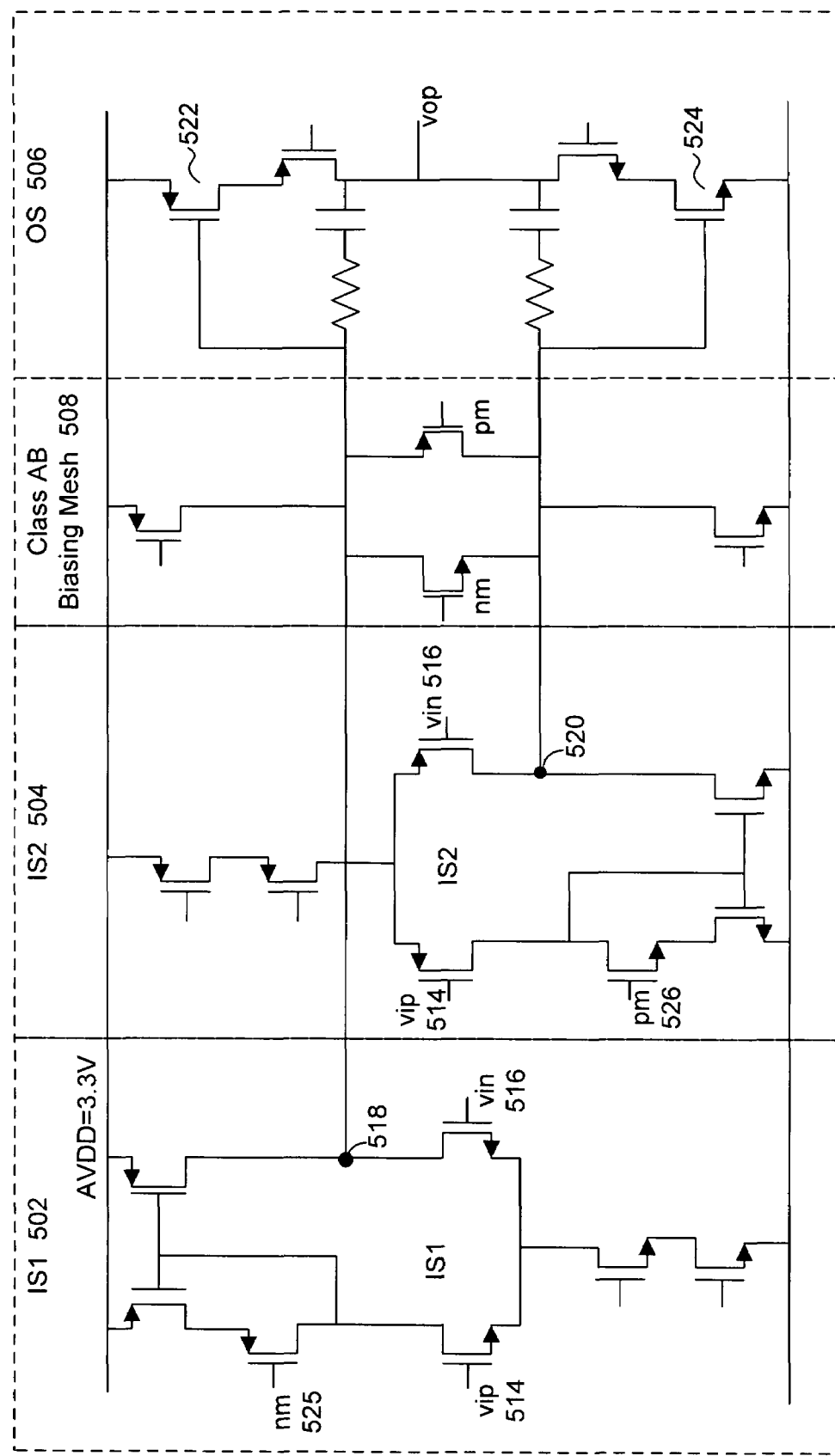
FIG. 5 is a schematic diagram of one embodiment of the present invention comprising two input stages.

Referring now to FIG. 5, there is shown a schematic diagram of one embodiment of the present invention. FIG. 5 comprises two input stages, IS1 (502) and IS2 (504), an output stage (506) and a class-AB biasing mesh (508). In one embodiment, the first input stage (502) is an NMOS input stage and the second input stage (504) is a PMOS input stage. The two inputs, vip (514) and vin (516), drive the gates of both input stages (502, 504). The two in-phase outputs of this composite input stage (518, 520) are directly connected to the two ends of the class-AB biasing mesh (508). Thus, the input stages (502, 504) drive the gates of the output transistors (522, 524) without passing through the additional delay of an intermediate stage as is typical in the prior art design. One skilled in the art will realize that the principles of the present invention are not limited to this particular schematic diagram and that implementations of other circuits which achieve the same result may be used.

Since an unbalance inside the input stages can modify the value of the mesh current hence changing the quiescent current in the output stage, it may be necessary to make sure that the two input stages are balanced. In one embodiment of the present invention, this is accomplished by inserting two cascode transistors (525, 526) at the drains of the two diodes of the input stages (502, 504). As a result, this embodiment of the present invention makes each pair of drains in each current mirror to operate at the same voltage and keeps the input stages balanced in the quiescent state.

In another embodiment, the class-AB amplifier of the present invention may be supplied by 3.3V voltage source, and 1V-tolerant transistors may be used in key parts of the circuit to take advantage of their small size and higher speed. The amplifying transistors in the output stage and the current mirrors in the input stage are only 1V-tolerant. This gives a small gate-source parasitic capacitance and a large transconductance to these transistors, both of which help reduce the power in the class-A biased input stage. Where 1V-tolerant transistors are used, it is important to make sure that these transistors are not stressed beyond their limit. In the case of the current mirrors in the input stage, this may be done by design while in the output stage, the protection of the 1V-devices may be done by adding thick-oxide (2.5V or 3.3V) devices to prevent the drains of the thin-oxide from reaching higher that 1V from the transistor's source voltage.

While the invention has been described with reference to certain embodiments, it will be understood by those skilled in the relevant art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An amplifier comprising:
 a class-AB biasing mesh;
 an output stage coupled to the class-AB biasing mesh; and
 a first input stage and a second input stage, both directly connected to the class-AB biasing mesh and the output stage, wherein the first input stage comprises a first input transistor and a first cascode transistor coupled to the first input transistor via a drain of the first cascode transistor and the second input stage comprises a second input transistor and a second cascode transistor coupled to the second input transistor via a drain of the second cascode transistor.

2. The amplifier in claim 1, wherein the first input stage is NMOS.

3. The amplifier in claim 1, wherein the second input stage is PMOS.

4. The amplifier in claim 1, wherein the first and second input stages of the amplifier further comprise a first differential pair having a pair of gates and a second differential pair having a pair of gates, wherein the gates of the first and second differential pairs are coupled together, and wherein the first differential pair and the second differential pair include the first input transistor and the second input transistor respectively.

5. The amplifier in claim 1, wherein the output stage further comprises output transistors and an output of the first input stage and an output of the second input stage are coupled to the output transistors.

6. An amplifier comprising:
a class-AB biasing mesh;
an output stage coupled to the class-AB biasing mesh; and
a first input stage and a second input stage, both directly connected to the class-AB biasing mesh and the output stage, wherein the first input stage and the second input stage comprise input 1V transistors, and the output stage comprises output 1V transistors and thick oxide transistors configured such that the thick oxide transistors prevent drain-source voltages of the output 1V transistors from exceeding 1V when used with a 3.3V supply.

7. An amplifier comprising:
a class-AB biasing mesh;
an output stage, directly connected to the class-AB biasing mesh;
a first input stage, directly connected to the class-AB biasing mesh and the output stage; and
a second input stage, directly connected to the class-AB biasing mesh and the output stage,
wherein a first input is coupled to both the first input stage and the second input stage and a second input is coupled to both the first input stage and the second input stage, and
wherein the first input stage comprises a first input transistor and a first cascode transistor coupled to the first input transistor via a drain of the first cascode transistor and the second input stage comprises a second input transistor and a second cascode transistor coupled to the second input transistor via a drain of the second cascode transistor.

8. The amplifier in claim 7, wherein the first input stage is NMOS.

9. The amplifier in claim 7, wherein the second input stage is PMOS.

10. The amplifier in claim 7, wherein transistors in the output stage are driven by the first input stage and the second input stage.

11. The amplifier in claim 7, wherein an output of the first input stage and an output of the second input stage are in-phase.

12. An amplifier comprising:
a class-AB biasing mesh;
an output stage directly connected to the class-AB biasing mesh;
a first input stage directly connected to the class-AB biasing mesh and the output stage; and
a second input stage directly connected to the class-AB biasing mesh and the output stage,
wherein a first input is coupled to both the first input stage and the second input stage and a second input is coupled to both the first input stage and the second input stage,
wherein the first input stage and the second input stage comprise input 1V transistors, and the output stage comprises output 1V transistors and thick oxide transistors configured such that the thick oxide transistors prevent drain-source voltages of the output 1V transistors from exceeding 1V when used with a 3.3V supply.

13. A class-AB amplifier integrated circuit comprising:
an output stage;
a class-AB biasing mesh, directly connected to the output stage, for providing a bias current;
a first input stage, directly connected to the output stage and the class-AB biasing mesh, for receiving an input voltage signal, and further comprising a first gate and a second gate;
a second input stage, directly connected to the output stage and the class-AB biasing mesh, for receiving the input voltage signal, and further comprising a first gate and a second gate,
wherein the first gate of the first input stage and the first gate of the second input stage are coupled together to receive the same input voltage; and
wherein the first input stage comprises a first input transistor and a first cascode transistor coupled to the first input transistor via a drain of the first cascode transistor and the second input stage comprises a second input transistor and a second cascode transistor coupled to the second input transistor via a drain of the second cascode transistor.

14. The integrated circuit of claim 13, wherein the second gate of the first input stage and the second gate of the second input stage are coupled together to receive the same input voltage.

15. The integrated circuit of claim 13, wherein the input voltage received by the first gates of the first and second input stage is vip and the input voltage received by the second gates is vin.

16. The integrated circuit of claim 13, wherein the first input stage is NMOS.

17. The integrated circuit of claim 13, wherein the second input stage is PMOS.

18. The integrated circuit of claim 13, wherein the first input stage and the second input stage result in in-phase outputs for driving the output stage.

19. A class-AIR amplifier integrated circuit comprising:
an output stage;
a class-AB biasing mesh, directly connected to the output stage, for providing a bias current;
a first input stage, directly connected to the output stage and the class-AB biasing mesh, for receiving an input voltage signal, and further comprising a first gate and a second gate;
a second input stage, directly connected to the output stage and the class-AB biasing mesh, for receiving the input voltage signal, and further comprising a first gate and a second gate,
wherein the first gate of the first input stage and the first gate of the second input stage are coupled together to receive the same input voltage, and
wherein the first input stage and the second input stage comprise input 1V transistors, and the output stage comprises output 1V transistors and thick oxide transistors configured such that the thick oxide transistors prevent drain-source voltages of the output 1V transistors from exceeding 1V when used with a 3.3V supply.

* * * * *

UNITED STATES PATENT AND TRADEMARK OFFICE
CERTIFICATE OF CORRECTION

PATENT NO. : 7,701,295 B2
APPLICATION NO. : 11/798293
DATED : April 20, 2010
INVENTOR(S) : Ovidiu Bajdechi It is certified that error appears in the above-identified patent and that said Letters Patent is hereby corrected as shown below:

In column 6, line 43, "A class-AIR amplifier" should be --A class-AB amplifier--.

Signed and Sealed this

Twenty-ninth Day of June, 2010

David J. Kappos
*Director of the United States Patent and Trademark Office*